(12) United States Patent
Miller et al.

(10) Patent No.: US 8,615,610 B2
(45) Date of Patent: Dec. 24, 2013

(54) INTERFACE SYSTEM AND METHOD WITH BACKWARD COMPATIBILITY

(75) Inventors: Gary L. Miller, Austin, TX (US); Ray C. Marshall, Harpenden (GB); Jehoda Refaeli, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 69 days.

(21) Appl. No.: 13/248,348

(22) Filed: Sep. 29, 2011

(65) Prior Publication Data
US 2013/0086283 A1      Apr. 4, 2013

(51) Int. Cl.
*G06F 3/00*      (2006.01)
*G06F 13/00*      (2006.01)

(52) U.S. Cl.
USPC ............. 710/8; 710/2; 710/5; 710/11; 710/14

(58) Field of Classification Search
None
See application file for complete search history.

(56) References Cited

U.S. PATENT DOCUMENTS

| | | |
|---|---|---|
| 6,825,698 B2 | 11/2004 | Wang et al. |
| 6,850,660 B2 | 2/2005 | Notani |
| 7,593,411 B2 | 9/2009 | McCrosky et al. |
| 2008/0117994 A1 | 5/2008 | Shetty |
| 2008/0285590 A1 * | 11/2008 | Mizuno et al. ................. 370/466 |
| 2009/0174439 A1 | 7/2009 | Luo |
| 2012/0017106 A1 * | 1/2012 | Curren et al. ................. 713/340 |

FOREIGN PATENT DOCUMENTS

EP      1089085 A1      4/2001

OTHER PUBLICATIONS

Analog Devices. "1.8V, 6 LVDS/12 CMOS Outputs Low Power Clock Fanout Buffer." ADCLK846 Rev. B. pp. 1-16. 2009-2010.
Product Data Sheet. ADC1112D125 "Dual 11-bit ADC; CMOS or LVDS DDR Digital Outputs." NXP Semiconductors. Rev. 2; Mar. 3, 2011. pp. 1-41.

* cited by examiner

*Primary Examiner* — Scott Sun
(74) *Attorney, Agent, or Firm* — Gary Stanford

(57) ABSTRACT

An interface including first and second transport protocol circuitry, a memory and a mode controller. The interface includes first and second physical interface types which are both selectively enabled to interface a set of pads. The first transport protocol circuitry is operative with the first type physical interface in a first mode and the second transport protocol circuitry is operative with the second type physical interface in a second mode. The memory stores a mode value indicative of the operating mode. The mode controller enables one of the physical interface types and a corresponding transport protocol based on the mode value. The first mode is the default mode, and the mode controller enables dynamic transition to the second mode. An escape indication may be enabled during the second mode for dynamic transition back to the first mode. Programmable timing values may be used to facilitate mode transitions.

20 Claims, 4 Drawing Sheets

FIG. 5
(STD TO HS)

500

| DEVICE PAD | STD (E.G., JTAG) | STD_SAFE (MODE_HS SET) | SWITCH (TIMEOUT1) | HS (TIMEOUT2) |
|---|---|---|---|---|
| P1 | TDI | HI-Z | LVDS TXP | LVDS TXP |
| P2 | TMS | HI-Z | LVDS TXN | LVDS TXN |
| P3 | TDO | HI-Z | LVDZ RXP | LVDZ RXP |
| P4 | TRST | HI-Z | LVDS RXN | LVDS RXN |
| P5 | TCLK (IN) | HI-Z | HSCLK (OUT) | HSCLK (OUT) |
| ESC | INHIBIT | INHIBIT | INHIBIT | ENABLED |

FIG. 6
(HS TO STD)

600

| DEVICE PAD | HS | HS_SAFE (MODE_HS CLEARED OR ESC) | STD (TIMEOUT1) |
|---|---|---|---|
| P1 | LVDS TXP | HI-Z | TDI |
| P2 | LVDS TXN | HI-Z | TMS |
| P3 | LVDZ RXP | HI-Z | TDO |
| P4 | LVDS RXN | HI-Z | TRST |
| P5 | HSCLK_OUT | HI-Z | TCLK_IN |
| ESC | ENABLED | INHIBIT | INHIBIT |

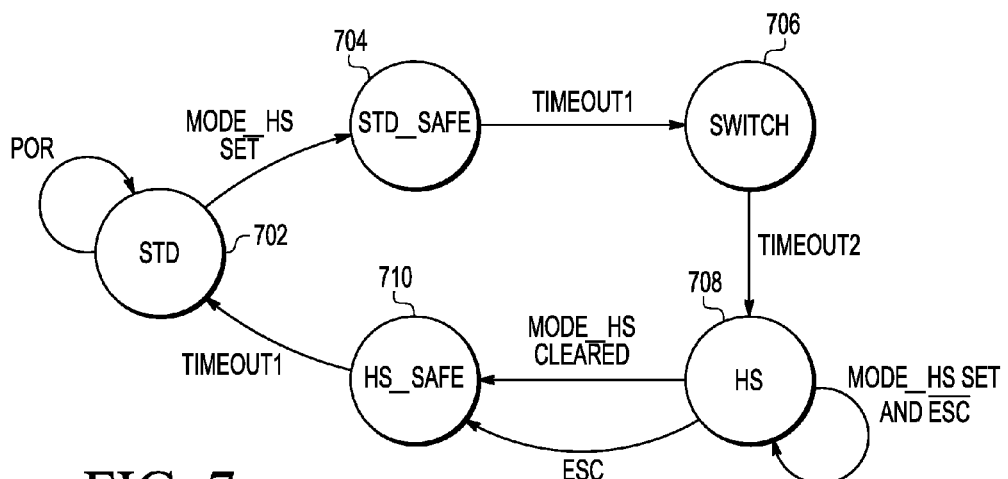

FIG. 7

INTERFACE SYSTEM AND METHOD WITH BACKWARD COMPATIBILITY

BACKGROUND OF THE INVENTION

1. Field of the Invention

The present invention relates generally to electronic interfaces, and more particularly to an interface system and method between different transport protocols with backward compatibility.

2. Description of the Related Art

In practice, some traditional electronic device or circuitry interfaces for that are configured for multiple uses or which are implemented according to de facto standards may not have adequate bandwidth for current or new uses. The Joint Test Action Group (JTAG) boundary scan according to the IEEE 1149.1 standard, for example, is one such de facto standard which is used for various purposes, such as debug (e.g., software debug), test (e.g., built-in self test procedures), electro-mechanical calibration, boundary scan, etc. The conventional JTAG interface uses relatively high single-ended voltage level signals that operate at a relatively modest bandwidth, such as about 25 Mega-Hertz (MHz). Most low cost tools use the conventional JTAG interface.

BRIEF DESCRIPTION OF THE DRAWINGS

The benefits, features, and advantages of the present invention will become better understood with regard to the following description, and accompanying drawings where:

FIG. 5 is a table illustrating the state of the pads of FIG. 2 and the status of the ESC indication detection of the device of FIG. 2 during transition from the standard mode to the high speed mode;

FIG. 6 is a table illustrating the state of the pads of FIG. 2 and the status of the ESC indication detection of the device of FIG. 2 during transition from the high speed mode to standard mode; and FIG. 7 is a simplified state diagram illustrating the states of operation of the device of FIG. 2 for transitioning between the standard and high speed modes.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

It is desired to provide a higher speed development protocol interface which provides higher bandwidth, such as for runtime visibility of internal data variables of an integrated circuit (IC). Newer protocol interfaces are designed to operate with low-voltage differential signaling providing significantly greater bandwidth, such as up to 300 MHz or more. It is desired to take advantage of the higher speed development protocol interface, while maintaining backward compatibility with existing or conventional protocols. It is also desired to transition between a lower speed mode and a higher speed mode while "in-flight" or while running. Existing interfaces are too slow, static or otherwise incompatible with existing configurations.

Figure 1:
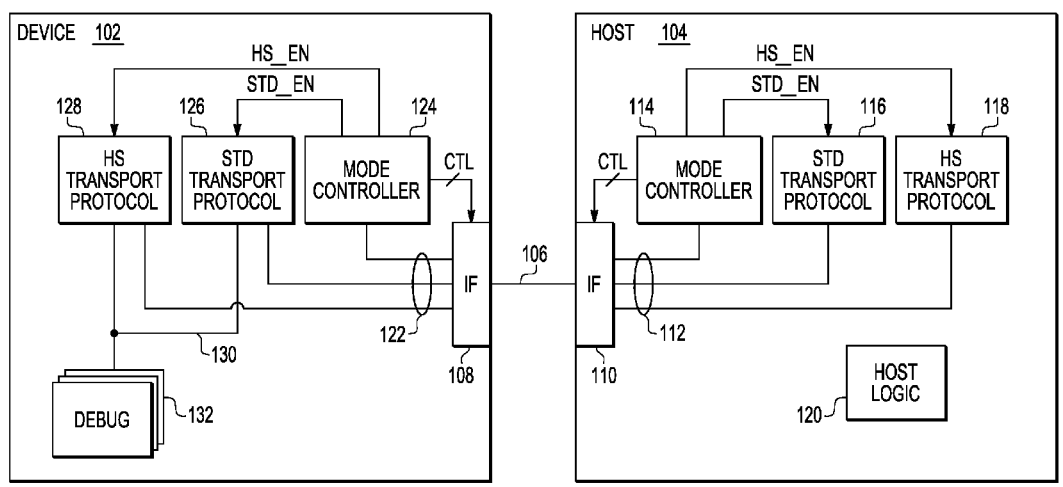
FIG. 1 is a simplified block diagram of an interface system including a physical interface according to one embodiment.

FIG. 1 is a simplified block diagram of an interface system 100 including a physical interface according to one embodiment. The physical interface may be an input and output interface, although it is understood that the physical interface may be solely an input interface or solely an output interface. The interface system 100 includes a device 102 coupled to a host 104 via a communications link 106. In one embodiment, the device 102 and the host 104 are each implemented as an integrated circuit (IC) and each may be configured according to a system-on-a-chip (SOC) configuration. The interface between the host 104 and the device 102 may be for any one of a variety of functions or purposes, such as debug, test, calibration, boundary scan, etc. The communications link 106 is implemented in any suitable manner, such as a connector, cable, conductive traces, etc., incorporating multiple conductive paths, wires, traces, etc., for conveying corresponding signals between the device 102 and the host 104. The device 102 includes a physical interface (IF) 108 and the host 104 includes a similar physical interface 110 for physically and electrically coupling to the link 106 to enable communications between the device 102 and the host 104.

In the simplified configuration, the host 104 is shown including a set of interfaces or a bus 112 coupling the interface 110 to a mode controller 114, standard (STD) transport protocol circuitry 116, and a high speed (HS) transport protocol circuitry 118. Host logic 120 may be included for setting up and controlling communications between the host 104 and the device 102, although alternative implementations are contemplated. The host logic 120 may coupled to the bus 112, or may be separately coupled to one or more of the mode controller 114, the STD transport protocol circuitry 116 and/or the HS transport protocol circuitry 118. The bus 112 may be implemented in conventional fashion with multiple conductive traces or the like for conveying data and/or control signals. The bus 112 may be implemented according to alternative methods, and may further include interface and/or control devices as understood by those skilled in the art.

The mode controller 114 provides an enable signal STD_EN to the STD transport protocol circuitry 116 and another enable signal HS_EN to the HS transport protocol circuitry 118. In general, the mode controller 114, either independently, or under control of the host logic 120, enables either the STD transport protocol circuitry 116 or the HS transport protocol circuitry 118 for communicating with the device 102. The mode controller 114 provides one or more control (CTL) signals to control and/or enable the physical interface 110 according to the operative one of the STD transport protocol circuitry 116 or the HS transport protocol circuitry 118.

The device 102 is shown configured in similar manner, including a set of interfaces or bus 122 coupling the physical interface 108 to the mode controller 124, STD transport protocol circuitry 126, and the HS transport protocol circuitry 128. The STD transport protocol circuitry 126 and the HS transport protocol circuitry 128 are each further coupled to one or more debug blocks 132 via a bus 130 including data and control signals. In a similar manner as for the host 104, the mode controller 124 provides an enable signal STD_EN to the STD transport protocol circuitry 126 and another enable signal HS_EN to the HS transport protocol circuitry 128. The mode controller 124 enables either the STD transport protocol circuitry 126 or the HS transport protocol circuitry 128 for communicating with the host 104. The mode controller 124 provides one or more control (CTL) signals to control and/or enable the physical interface 108 according to the operative one of the STD transport protocol circuitry 126 or the HS transport protocol circuitry 128.

As further described herein, each of the physical interfaces 108 and 110 includes a set of pads (e.g., 202, FIG. 2) for physically and electrically interfacing the externally provided link 106. Each of the interfaces 108 and 110 further includes corresponding pad interface (IF) circuitry (e.g., 204, FIG. 2) for interfacing the pads with the enabled one of the STD transport protocol or the HS transport protocol via the corresponding internal connections (e.g., 112, 122).

In one embodiment, upon power on or reset (POR), the device 102 and the host 104 initially operate in the "standard" mode in which the STD transport protocol circuitry 116 of the host 104 and the STD transport protocol circuitry 126 of the device 102 are initially enabled to establish communications. The host 104 sends a command and/or communication parameters to the device 102 for dynamically switching "on the fly" or "in-flight" to the high-speed mode, in which the mode controller 124 transitions operation to the HS mode by enabling the HS transport protocol circuitry 128 within the device 102. Likewise, the mode controller 114 transitions operation to the HS mode by enabling the HS transport protocol circuitry 118 within the host 104. After the transition is complete, the device 102 and the host 104 may communicate information at a much higher rate according to high-speed operation for significantly higher bandwidth performance.

The host 104 may send another command and/or communication parameters to the device 102 for dynamically transitioning back to the lower speed standard mode. In this manner, the device 102 and the host 104 are both configured for high speed operation, and are both initially configured for backward compatibility with the standard mode.

In one embodiment, enabling detection of an escape indication allows for recovering from the possibility of losing communication in the higher signaling speed mode due to external disturbances or the like. During the high speed mode, if the host 104 detects a loss of communication with the device 102 for any reason, it may assert an escape indication or the like to cause the device 102 to switch back to the standard mode to re-establish communications. In one embodiment, the host 104 is configured to drive one or more of the pads 202 of the physical interface 108 out of differential common mode range or the like, such as forcing the signal to 0 Volts (V) or ground or the like, and the physical interface 108 is configured to detect the out of differential range signal and to internally assert an escape signal or the like. The mode controller 124 detects the escape signal asserted and transitions operation back to the standard mode.

In one embodiment, the physical interface 108 is dynamically transitioned from a first type physical interface (standard mode) to a second type physical interface (high speed mode) and back again as needed or desired. In one embodiment, the first type physical interface employs single-ended signaling, whereas the second type physical interface employs low voltage differential signaling for higher bandwidth performance. In a more specific embodiment, the first type physical interface may be implemented according to the JTAG IEEE 1149.1 standard, although other types of standards are contemplated, such as the Serial Peripheral Interface (SPI) or the like. JTAG operates at a communication bandwidth of about 10-30 MHz. The second type physical interface may be implemented according to low-voltage differential signaling (LVDS) for higher bandwidth performance. LVDS is an electrical digital signaling system with a common mode voltage of about 1.2V and may operate at a communication bandwidth of up to 300 MHz or even greater.

In one embodiment, the host 104 sends a command packet or the like causing the device 102 to set a high speed enable bit in a register or the like, which causes the mode controller 124 to transition to the high speed mode. The host 104 may further transmit one or more programmable timing values, which are used by the device 102 to establish corresponding time period(s) to account for switching circuit delays and settling of signals as further described herein.

Figure 2:
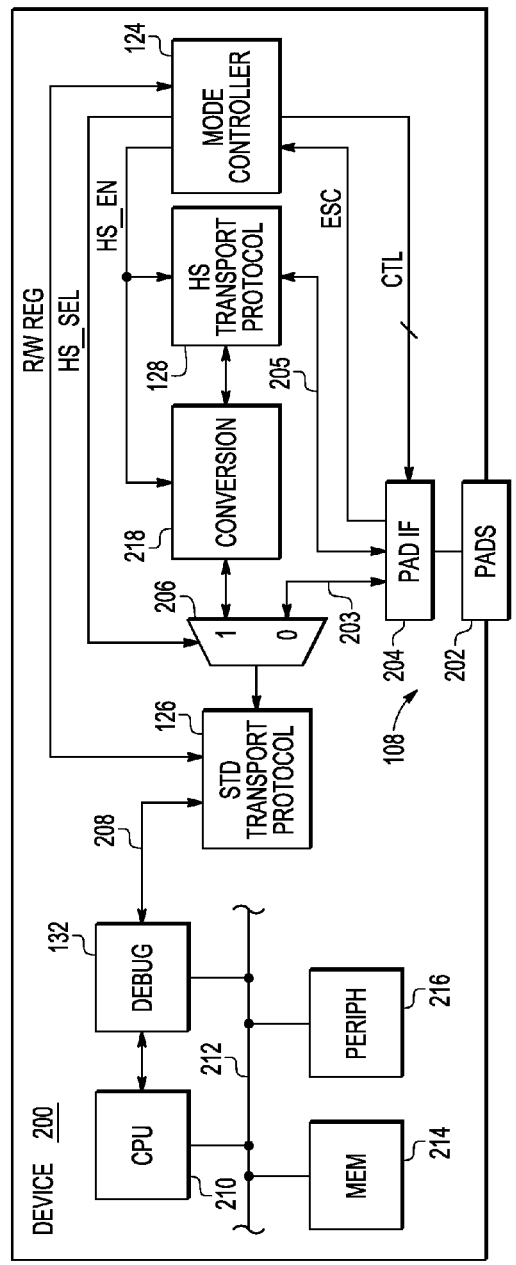
FIG. 2 is a more detailed block diagram of a device implemented according to one embodiment of the device of FIG. 1.

FIG. 2 is a more detailed block diagram of a device 200 implemented according to one embodiment of the device 102. The physical interface 108 includes the set of pads 202 for coupling to the link 106 and the corresponding pad IF circuitry 204 coupled to the pads 202. The pad IF circuitry 204 is selectably configured for interfacing the STD transport protocol circuitry 126 via a set of signal lines 203 and select logic 206, or for interfacing HS transport protocol circuitry 128 via a set of signal lines 205. The pad IF circuitry 204 further provides at least one escape (ESC) signal to the mode controller 124, which provides the CTL signals to control the configuration of the pad IF circuitry 204 depending upon the mode of operation.

In this configuration, the STD transport protocol circuitry 126 is coupled to a debug block 132 via a separate interface 208. The debug logic 132 is further coupled to a central processing unit (CPU) 210 of the device 200. The CPU 210 is further coupled to memory 214 and one or more peripherals 216 via a system bus 212. The debug logic 132 may also be coupled to the system bus 212 for memory operations. In one embodiment, the debug block 132 monitors operations of the CPU 210. The STD transport protocol circuitry 126 may perform boundary scan operations, debug operations, calibration operations of the CPU 210 via the debug block 132, etc.

The HS transport protocol circuitry 128 may be coupled in similar manner as the STD transport protocol circuitry 126 to the debug logic 132, in which one is enabled at a time depending upon the mode of operation. In the illustrated embodiment, the STD transport protocol circuitry 126 internally operates at a sufficiently high speed to handle high speed operations of the HS transport protocol circuitry 128. When operating in standard mode, however, the physical interface 108 operates at a much lower bandwidth configured for standard communications. In the high speed operating mode, the HS transport protocol circuitry 128 communicates with the host 104 via the physical interface 108 configured for high speed communications, and conversion logic 218 is provided for converting communications to be compatible with the STD transport protocol circuitry 126. The conversion logic 218 is coupled to the input of the STD transport protocol circuitry 126 through one input of the select logic 206. In the illustrated embodiment, the select logic 206 is implemented as a multiplexer (MUX) for selecting either the signal lines 203 or the conversion logic 218 depending upon the mode of operation as indicated by a select signal HS_SEL provided by the mode controller 124.

Upon POR, the device 200 is placed in the standard mode of operation by default. The mode controller 124 asserts the CTL signals to control the pads 204 for the standard mode. This allows for backward compatibility to a host that may only support the standard protocol. The mode controller 124 asserts the HS_EN signal low (or is negated low) to disable the HS transport protocol circuitry 128 and the conversion logic 218 and asserts the HS_SEL signal to control the select logic 206 to select the signal lines 203. Thus, the pads 202 are coupled via the pad IF circuitry 204 to the STD transport protocol circuitry 126 via the select logic 206. The host 104 is also configured in the standard mode and communicates using the STD transport protocol circuitry 116 in a similar manner as conventional configurations.

The host 104 sends a command or the like to the STD transport protocol circuitry 126 of the device 200 to transition to the high speed mode. The STD transport protocol circuitry 126 programs a control register (e.g., 302, FIG. 3) within the mode controller 124 to set a mode value MODE_HS (FIG. 3) via a read/write register (R/W REG) path, and may further send one or more timing values which are programmed to selected values to facilitate the transition. The R/W REG path includes one or more signals to facilitate communication between the STD transport protocol circuitry 126 and the mode controller 124. The mode controller 124 responds by asserting the CTL signals to transition the pad IF circuitry 204 for the signal lines 205. The mode controller 124 asserts the HS_EN signal high to enable the HS transport protocol circuitry 128 and asserts HS_SEL to switch the select logic 206 to select the conversion logic 218. When the transition is completed, the host 200, which has also transitioned to the high speed mode, communicates with the HS transport protocol circuitry 128 via the pad IF circuitry 204 and the signal lines 205. Communications are converted by the conversion logic 218, so that the host 104 indirectly communicates with the STD transport protocol circuitry 126. It is noted that the high speed communication path via the pad IF circuitry 204 configured to high speed mode, the signal lines 205, the HS transport protocol circuitry 128 and the conversion logic 218 is substantially faster than the standard communication path via the pad IF circuitry 204 configured for the standard mode and the signal lines 203.

Figure 3:
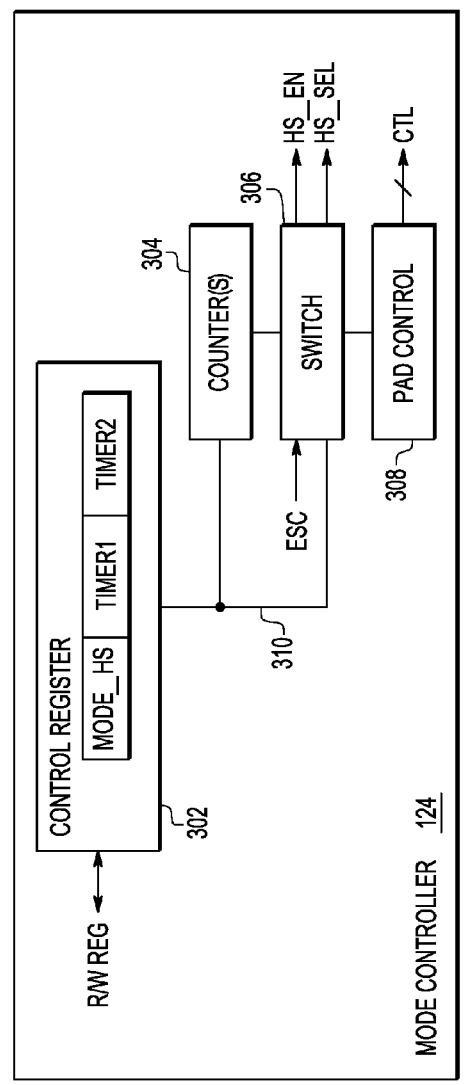
FIG. 3 is a simplified block diagram of the mode controller of FIGS. 1 and 2 implemented according to one embodiment.

FIG. 3 is a simplified block diagram of the mode controller 124 implemented according to one embodiment. The mode controller 124 includes the control register 302, one or more counters 304, switch logic 306 and a pad controller 308. The control register 302 is implemented using any suitable type of programmable memory device. The switch logic 306 and the counters 304 are coupled to the control register 302 via a bus 310 (or suitable set of signal lines), and the counters 304, switch logic 306 and pad controller 308 are shown coupled to each other for controlling and transitioning between the modes of operation. The R/W REG path interfaces the control register 302. The ESC signal is provided to the switch logic 306, which provides the HS_EN and HS_SEL signals. The pad controller 308 provides the CTL signals for controlling the pad IF circuitry 204.

The control register 302 stores several binary communication parameters for controlling and transitioning between the modes of operation. As shown, the control register 302 stores the mode control value MODE_HS and two timer values TIMER1 and TIMER2. The MODE_HS may be a single bit which is cleared (low) for standard mode and set (high) for the high speed mode, or vice-versa. The TIMER1 value is loaded into the counter 304 for determining a first time period indicated by a first timeout TIMEOUT1, and the TIMER2 value is loaded into the counter 304 for determining a second time period indicated by a second timeout TIMEOUT2.

Upon POR, the MODE_HS value is initially cleared low to indicate the standard mode. The host 104 sends one or more communications or commands to further store values into TIMER1 and TIMER2 to program the first and second time periods, and to set the MODE_HS high to transition into the high speed mode. The switch logic 306 detects MODE_HS set high and indicates to the pad controller 308 to transition to the high speed mode. The pad controller 308 responds by asserting the CTL signals to control the pad IF circuitry 204 to place the interface 108 into an intermediate safe mode as further described below. The switch logic 306 also asserts the HS_EN signal high to enable the HS transport protocol circuitry 128 and to begin transitioning to the high speed mode. The TIMER1 value is loaded into the counter 304 to initiate the first time period.

After the first time period upon TIMEOUT1, the switch logic 306 indicates to the pad controller 308 to enable the pad IF circuitry 204 to enable the high speed interface. The switch logic 306 also asserts the HS_SEL signal to select the conversion logic 218. The counter 304 is reset and the TIMER2 value is loaded into the counter 304 to initiate the second time period. After expiration of the second time period upon TIMEOUT2, the switch logic 306 enables detection of a escape indication by the pad IF circuitry 204. When the escape indication is detected, the pad IF circuitry 204 asserts the ESC signal to initiate transition back to the standard mode. The time periods allow the device 102 and the host 104 to both settle into high speed mode.

During the high speed mode, if the MODE_HS value is cleared, or if the ESC signal is detected asserted by the switch logic 306, the pad controller 308 transitions the pad IF circuitry 204 to an intermediate safe mode and TIMER1 is loaded into the counter 304 to initiate the first time period. The ESC indication detection is inhibited, and HS_EN is negated to transition back to the standard mode. After the first time period upon TIMEOUT1, the pad controller 308 asserts the CTL signals to enable the interface 108 into standard mode, and HS_SEL is asserted to select the signal lines 203.

Figure 4:
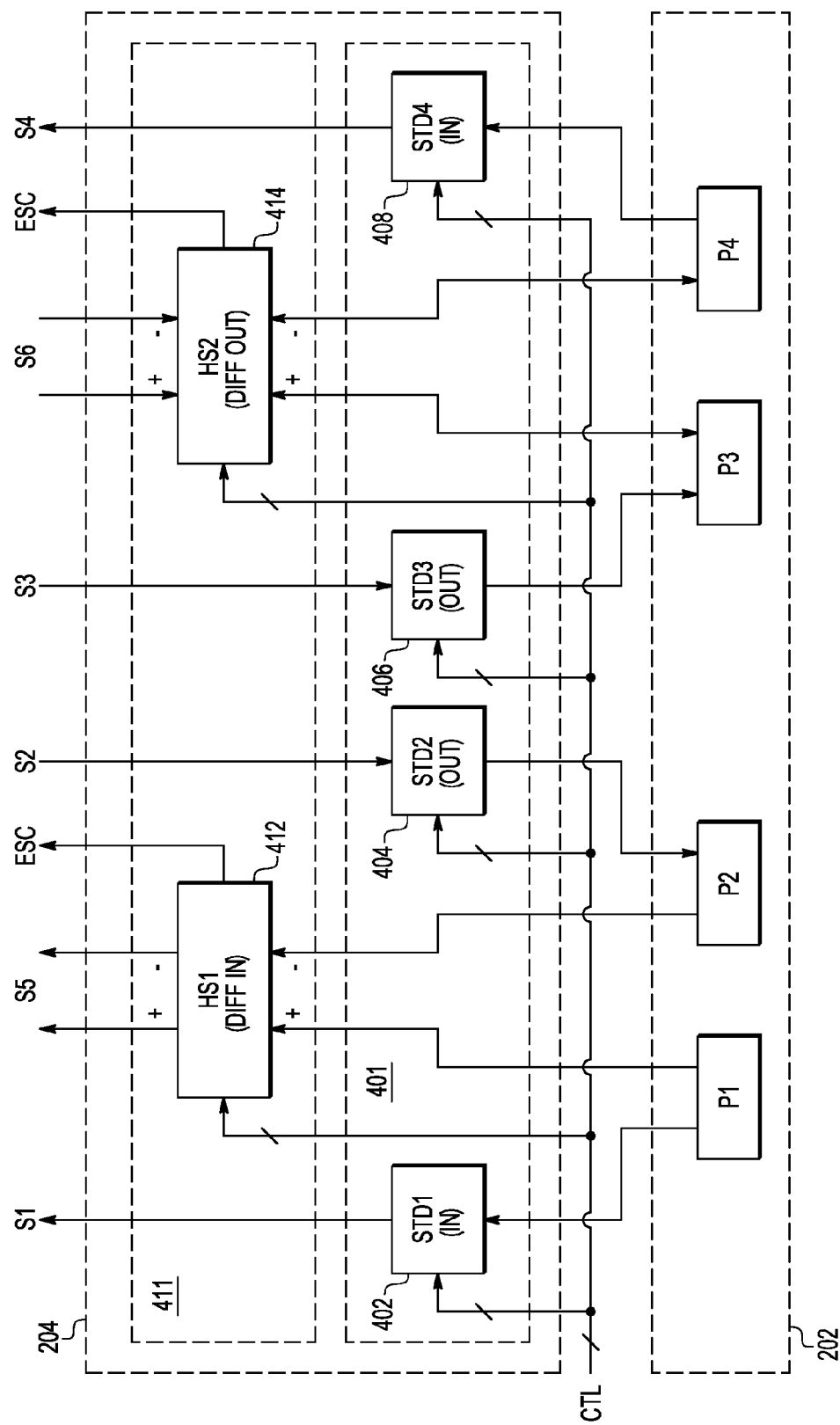
FIG. 4 is a simplified block diagram of a representative portion of the physical interface of FIG. 2 including a portion of the pads and a corresponding portion of the pad IF circuitry.

FIG. 4 is a simplified block diagram of a representative portion of the physical interface 108 including a portion of the pads 202 and a corresponding portion of the pad IF circuitry 204. Additional pads and corresponding circuitry may be included but are not shown. The pads 202 include pads P1-P4 for interfacing external devices, such as via the communications link 106 or the like. The pad IF circuitry 204 is divided into a first type physical interface 401 and a second type physical interface 411 sharing the common set of the pads 202. The first type physical interface 401 includes four pad IF blocks 402, 404, 406 and 408 operative in the standard mode (STD1, STD2, STD3 and STD4, respectively). The second type physical interface 411 includes a pair of pad IF blocks 412 and 414 (HS1 and HS2, respectively). The CTL signals are provided to control each of the pad IF blocks 402, 404, 406, 408, 412 and 414, such as including enable signals, safe mode signals, etc.

In the standard mode, the pad IF blocks 412 and 414 of the second type physical interface 411 are disabled and the pad IF blocks 402, 404, 406 and 408 of the first type physical interface 401 are enabled. When enabled, the pad IF blocks 402 and 408 are configured as input pads for receiving external single-ended signals S1 and S4 and conveying S1 and S4 to the STD transport protocol circuitry 126 via signal lines 203. When enabled, the pad IF blocks 404 and 406 are configured as output pads for conveying internal single-ended signals S2 and S3 from the STD transport protocol circuitry 126 to an external device via corresponding pads P2 and P3. Additional pads and corresponding circuitry may be included for additional input, output or input and output (I/O) signals depending upon the specific implementation.

In the high speed mode, the pad IF blocks 412 and 414 are enabled and the pad IF blocks 402, 404, 406 and 408 are disabled. When enabled, the pad IF block 412 is configured as a differential input pad IF block for receiving and conveying a differential signal S5 provided to the pads P1 and P2 to the HS transport protocol circuitry 128 via signal lines 205. As shown, the pad P1 is configured as the positive (+) polarity and the pad P2 is configured as the negative (−) polarity of the differential input signal S5. When enabled, the pad IF block 414 is configured as a differential output pad for conveying a differential signal S6 from the HS transport protocol circuitry 128 to the pads P3 and P4. As shown, the pad P3 is configured as the positive (+) polarity and the pad P4 is configured as the negative (−) polarity of the differential output signal S6. Again, additional pads and circuitry may be included for additional input, output or I/O signals. In the high speed mode, the additional signals may be differential or single-ended. For example, a high speed clock signal may be conveyed on an additional HS pad and corresponding pad.

The pad IF blocks 412 and 414 are each shown providing the ESC signal. The ESC signal may be provided by any one of multiple pad IF blocks, or may be provided by one selected pad IF block. During the standard mode, the pad IF blocks 412 and 414 are disabled and the ESC signal is effectively inhibited from having any operational effect. During the high speed mode, the ESC signal is asserted low (or negated) during normal communication operations between the device 102 and the host 104. If for any reason communication between the device 102 and the host 104 is lost during the high speed mode, such as due to external disturbances or the like, the host 104 provides an escape indication to one or both of the pads P1 and P2 which is detected by the pad IF block 412. Alternatively, or in addition, the host 104 provides an escape indication to one or both of the pads P3 and P4 which is detected by the pad IF block 414.

As an example, the pad IF blocks 412 and 414 both operate in a differential mode within a differential common mode voltage with a known or otherwise acceptable differential common mode voltage range, and in which the signals coupled to the pads P3 and P4 also have a differential common mode voltage range. The host 104 may generate a single-ended signal on either the signals provided to pads P1 or P2 (or P3 or P4) or a differential signal on both that is out of the normal common mode range. As an example, the host 104 may force signals provided to pads P1 and P2 to 0V (or ground) thereby effectively violating the normal common mode voltage specification. The pad IF block 412 detects the common mode voltage range violation and asserts the ESC signal to the mode controller 124, which transitions operation out of the high speed mode and back into the standard mode of operation.

During transition periods between the standard and high speed modes, one or more of the IF blocks of the pad IF circuitry 204 and corresponding pads 202 may be placed into a "safe" mode or the like to facilitate the transition. Accordingly, an pad IF block may place one or both of the external signal (via corresponding pad) and the internal signal into a high impedance state, referred to as the "HI-Z" state. In addition or in the alternative, one or both of the external signal (and pad) and the internal signal may be placed into a known state or signal level, such as logic zero or logic one. As an example, during transition from the standard mode to the high speed mode, the pad IF block 402 may place pad P1 into a HI-Z state, such as by disabling an internal buffer or the like, and may assert the signal S1 to any suitable or otherwise predetermined value, such as logic one, logic zero, or HI-Z. Such transition operation inhibits or otherwise reduces spurious signals or voltage/current spikes and facilitates smooth transition between operating modes.

FIG. 5 is a table 500 illustrating the state of the pads 202 and the status of ESC indication detection of the device 102 during transition from the standard mode to the high speed mode. The state of each of the pads 202 is determined by or otherwise reflects the status of the pad IF circuitry 204 while transitioning between the first type physical interface 401 and the second type physical interface 411. In this case, the standard mode is defined as JTAG and the first type physical interface 401 includes signaling according to JTAG, and the high speed mode is defined using LVDS signaling with a high speed clock output HSCLK. In one embodiment, HSCLK is generated on the device 200 and provided to the pads 202 during the high speed mode.

The table 500 includes columns 501-505, in which the first column 501 lists exemplary pads P1-P5 and ESC. The second column 502 lists the functions of the pads P1-P5 for the standard state, which is specifically defined for JTAG in the illustrated embodiment, although it is noted that other standard interface methods are contemplated. In this case, the first type physical interface 401 is enabled (enabling pad IF blocks 402, 404, etc.) and the pads P1-P5 of the device 102 are defined as the Test Data In (TDI), Test Mode Select (TMS), Test Data Out (TDO), Test Reset (TRST), and Test Clock (TCLK), respectively. TCLK is defined as an input for the device 102, whereas the corresponding pad for the host 104 is an output since the host 104 provides the test clock signal for the interface during the standard mode. The ESC indication detection is inhibited in the standard mode so that the state of the ESC signal is ignored.

The third column 503 is a standard safe (STD_SAFE) mode which is entered when the mode controller 124 detects that the MODE_HS value (or bit) in the control register 302 is set or otherwise detected as being set. The mode controller 124 asserts the CTL signals to place the first type physical interface 401 in a safe mode in which the pads P1-P5 are placed into in the HI-Z (high-impedance) state. The ESC indication detection remains inhibited. The TIMER1 value is loaded into the counter 304 and the first time period is initiated (such as by initiating the applicable counter 304).

The fourth column 504 is a switch mode that is entered upon TIMEOUT1 after the first time period is completed (e.g., completion of the TIMER1 count of the counter 304). The HS transport logic 128 is enabled and the CTL signals are asserted to enable the second type physical interface 411 so that the pads 202 are defined for the high speed mode. Pads P1 and P2 are collectively defined as a differential LVDS transmit signal including a positive polarity TXP on P1 and a negative polarity TXN on P2. It is noted that during transitioning, the differential LVDS transmit signal may not be used so that these pads may alternatively remain in the HI-Z state. Pads P3 and P4 are collectively defined as a differential LVDS receive signal including a positive polarity RXP on P3 and a negative polarity RXN on P4. P5 provides the high speed clock HSCLK which is output from the device 102 to the host 104 to control timing of high speed operation. The ESC indication detection remains inhibited. The TIMER2 value is loaded into the counter 304 and the second time period is initiated.

The fifth column 505 is the high speed (HS) mode that is entered upon TIMEOUT2 after the second time period is completed. At this time the ESC indication detection is enabled and fully functional as a failsafe mechanism, and the pads 202 are fully operational for the high speed mode.

FIG. 6 is a table 600 illustrating the state of the pads 202 and the status of the ESC indication detection of the device 102 during transition from the high speed mode to standard mode. The first column 601 is the same as column 501 listing the pads and the status of ESC indication detection. The second column 602 is the same as column 505 indicating that the HS mode is operational and enabled. The third column 603 is a high speed safe mode (HS_SAFE) for transitioning to the standard mode when either the MODE_HS value is cleared or the ESC signal is asserted. In the HS_SAFE mode, the second type physical interface 411 is placed into a safe mode so that the pads P1-P5 are placed into the HI-Z state and the ESC indication detection is inhibited. Also, the TIMER1 value is loaded into the counter 304 and the first time period is initiated. The fourth column 604 is the standard mode which is re-entered upon TIMEOUT1 when the first time period expires. The ESC indication detection remains inhibited during the standard mode of operation.

FIG. 7 is a simplified state diagram illustrating the states of operation of the device 102 for transitioning between the standard and high speed modes. Upon POR, operation is initially in the standard mode as shown by state 702 (column 502 of table 500). Operation remains in the standard mode until the MODE_HS value is set.

When MODE_HS is detected set, operation eventually advances to the STD_SAFE mode as indicated at state 704 (and as illustrated by column 503 of table 500) for transitioning to the HS mode. The HS_EN signal is asserted to enable the HS transport protocol circuitry 128 and the conversion logic 218. The TIMER1 value is loaded into the counter 304 and the first time period is initiated.

Upon TIMEOUT1 (expiration of the first timer period), operation eventually advances to the SWITCH mode as shown by state 706 (column 504 of table 500). The HS transport protocol circuitry 128 and the conversion logic 218 are enabled and operative. The second type physical interface 411 is enabled and operative, and the HS_SEL signal is asserted to enable high speed operation. The TIMER2 value is loaded into the counter 304 and the second time period is initiated.

Upon TIMEOUT2, operation eventually transitions to the high speed operating mode as shown by state 708, and as illustrated by columns 505 of table 500 and column 602 of table 600. The escape indication is enabled for detection of the escape indication via the ESC signal. Operation remains in the high speed mode while MODE_HS remains set and while the ESC signal remains negated, as indicated by $\overline{ESC}$.

Whenever the MODE_HS value is detected clear or the ESC signal is asserted high, operation transitions to the HS_SAFE mode as shown by state 710 and as illustrated by column 603 of table 600 for transitioning back to the standard mode. The TIMER1 value is loaded into the counter 304 and the first time period is initiated. Upon TIMEOUT1, operation returns to the standard mode at state 702, as illustrated by column 604 of table 600.

An interface including a physical interface, first and second transport protocol circuitry, a memory and a mode controller. The physical interface includes a first type physical interface and a different second type physical interface which are both selectively enabled to interface a common set of pads. The first transport protocol circuitry is operative with the first type physical interface in a first operating mode, and the second transport protocol is operative with the second type physical interface in a second operating mode. The memory stores a mode value indicative of one of the first and second operating modes. The mode controller enables the first type physical interface to operate with the first transport protocol in the first operating mode upon power up or reset, and dynamically transitions to the second operating mode by disabling the first type physical interface and enabling the second type physical interface to operate with the second transport protocol when the second operating mode is indicated by the mode value.

In various embodiments, the mode controller may dynamically transition operation back to the first operating mode by disabling the second type physical interface and enabling the first type physical interface to operate with the first transport protocol when the first operating mode is indicated by the mode value. A programmable time value may be used for transitioning between the first and second operating modes. The mode value and one or more programmable timing values may be stored in a memory for providing programmable time periods.

An escape indication may be provided to enable transition back to the first operating mode, such as in the event of a loss of communications. In one embodiment, for example, the second type physical interface may operate within a predetermined voltage range and be configured to assert or otherwise provide an escape signal when the predetermined voltage range is exceeded. The escape feature is inhibited in the first operating mode and enabled in the second operating mode.

In one embodiment, a safe mode is used for transitioning between the operating modes. In one embodiment, for example, the first and second physical interfaces may be configured to place the common set of pads in a high impedance state or otherwise a known logic state while transitioning between operating modes. In a more specific embodiment, the mode controller dynamically places the physical interface into a safe mode, initiates a first time period, enables the second type physical interface to operate with the second transport protocol upon expiration of the first time period, initiates a second time period, and enables detection of an escape signal upon expiration of the second time period.

The mode controller may dynamically transition operation back to the first operating mode when indicated by the mode value or by the escape signal, by disabling the second type physical interface and enabling the first type physical interface to operate with the first transport protocol.

The first type physical interface may be configured for single-ended signaling at a first bandwidth via the common set of pads, and the second type physical interface may be configured for low-voltage differential signaling at a second, higher bandwidth via the common set of pads. The first operating mode may be according to a de-facto standard, such as JTAG or the like.

A method of operating an interface according to one embodiment includes initially operating in a first operating mode by enabling a first type physical interface coupled to a common set of pads to operate according to a first transport protocol, monitoring a mode value indicative of one of the first operating mode and a second operating mode, and dynamically transitioning to the second operating mode by enabling a second type physical interface coupled to the common set of pads to operate with a second transport protocol when indicated by the mode value.

The method may include dynamically transitioning back to the first operating mode by enabling the first type physical interface to operate with the first transport protocol when indicated by the mode value.

The dynamically transitioning to the second operating mode may include placing the first type physical interface into a safe mode, enabling operation according to the second transport protocol, and switching operation to the second transport protocol using the second type physical interface when the second transport protocol operation is enabled.

The method may further include initiating a time period while in the safe mode, and switching operation to the second transport protocol using the second type physical interface after expiration of the time period. The method may further include receiving a command indicating transitioning to the second operating mode while operating in the first operating mode, where the command includes a time value indicative of the time period.

The method may further include initiating a first time period while in the safe mode, switching operation to the second transport protocol using the second type physical interface after expiration of the first time period, monitoring, by the second type physical interface when enabled, an out of range condition and providing an escape signal when the out of range condition is detected, initiating a second time period after the expiration of the first time period, and enabling detection of the escape signal after expiration of the second time period.

The method may further include receiving a command indicating transitioning to the second operating mode while operating in the first operating mode, where the command includes a first time value indicative of the first time period and a second time value indicative of the second time period.

The method may further include dynamically transitioning back to the first operating mode by enabling the first type physical interface to operate according to the first transport protocol when indicated by the mode value or when the escape signal is detected. The method may further include converting between the first and second transport protocols while in the second operating mode.

A method of operating an interface according to another embodiment includes monitoring a mode value indicative of one of a first transport protocol and a second transport protocol, enabling a first type physical interface coupled to pads to operate according to the first transport protocol when the first transport protocol is indicated by the mode value, enabling a second type physical interface coupled to the pads to operate according to the transport protocol when the second transport protocol is indicated by the mode value, and, when operating according to the second transport protocol, dynamically switching back to operating according to the first transport protocol when an out of range condition is detected on a pad.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. An interface, comprising:
a physical interface including a first type physical interface and a different second type physical interface which are both selectively enabled to interface a common set of pads;
first transport protocol circuitry operative with said first type physical interface in a first operating mode;
second transport protocol circuitry operative with said second type physical interface in a second operating mode;
a memory which stores a mode value indicative of one of said first and second operating modes;
a mode controller which enables said first type physical interface to operate with said first transport protocol circuitry in said first operating mode upon power up or reset, and which dynamically transitions to said second operating mode by disabling said first type physical interface and enabling said second type physical interface to operate with said second transport protocol circuitry when said second operating mode is indicated by said mode value; and
wherein said mode controller programs said mode value in response to a command received by an operative one of said first transport protocol circuitry and said second transport protocol circuitry via an enabled one of said first type physical interface and said second type physical interface.

2. The interface of claim 1, wherein said mode controller dynamically transitions back to said first operating mode by disabling said second type physical interface and enabling said first type physical interface to operate with said first transport protocol circuitry when said first operating mode is indicated by said mode value.

3. The interface of claim 2, wherein:
said memory stores a programmable time value; and
wherein said mode controller dynamically transitions back to said first operating mode by placing said physical interface into a safe mode, and by enabling said first type physical interface to operate with said first transport protocol circuitry upon expiration of a time period based on said programmable time value.

4. The interface of claim 1, wherein:
said memory stores a programmable time value; and
wherein said mode controller dynamically transitions to said second operating mode by placing said physical interface into a safe mode, and by enabling said second type physical interface to operate with said second transport protocol circuitry upon expiration of a time period based on said programmable time value.

5. The interface of claim 1, wherein:
said memory stores a programmable time value;
wherein said mode controller dynamically transitions to said second operating mode to initiate at least one time period based upon said programmable time value upon enabling said second type physical interface, and enables detection of an escape signal upon expiration of said at least one time period; and
wherein said escape signal is configured to indicate transition back to said first operating mode.

6. The interface of claim 1, wherein:
said memory further stores a first programmable time value and a second programmable time value;
wherein said second type physical interface operates within a predetermined voltage range and asserts an escape signal when said predetermined voltage range is exceeded; and
wherein said mode controller dynamically transitions to said second operating mode by placing said physical interface into a safe mode, by initiating a first time period based on said first programmable time value, by enabling said second type physical interface to operate with said second transport protocol circuitry upon expiration of said first time period, by initiating a second time period based on said second programmable time period, and by enabling detection of said escape signal upon expiration of said second time period.

7. The interface of claim 6, wherein said mode controller dynamically transitions back to said first operating mode by disabling said second type physical interface and enabling said first type physical interface to operate with said first transport protocol circuitry when said first operating mode is indicated by said mode value or by said escape signal.

8. The interface of claim 1, wherein said first type physical interface and said first transport protocol circuitry operate according to JTAG with single-ended signaling at a first bandwidth, and wherein said second type physical interface and said second transport protocol circuitry operate using low-voltage differential signaling at a second bandwidth which is greater than said first bandwidth.

9. The interface of claim 1, wherein said first type physical interface comprises a first set of blocks configured for single-ended signaling at a first bandwidth via said common set of pads, and wherein said second type physical interface comprises a second set of blocks configured for low-voltage differential signaling at a second bandwidth which is greater than said first bandwidth via said common set of pads.

10. The interface of claim 1, further comprising conversion logic which translates between said first transport protocol circuitry and said second transport protocol circuitry during said second mode of operation.

11. A method of operating an interface, comprising:
initially operating in a first operating mode by enabling a first type physical interface coupled to a common set of pads to operate according to a first transport protocol;
monitoring a mode value indicative of one of the first operating mode and a second operating mode; and
dynamically transitioning to the second operating mode by enabling a second type physical interface coupled to the common set of pads to operate according to a second transport protocol when indicated by the mode value; and
receiving, via an enabled one of the first type physical interface and the second type physical interface, a command for setting the mode value.

12. The method of claim 11, further comprising dynamically transitioning back to the first operating mode by enabling the first type physical interface to operate according to the first transport protocol when indicated by the mode value.

13. The method of claim 11, wherein said dynamically transitioning to the second operating mode comprises:
placing the first type physical interface into a safe mode;
enabling operation according to the second transport protocol; and
switching operation to the second transport protocol using the second type physical interface when the second transport protocol operation is enabled.

14. The method of claim 13, further comprising:
initiating a time period while in the safe mode; and
said switching comprising switching operation to the second transport protocol using the second type physical interface after expiration of the time period.

15. The method of claim 14, wherein said receiving a command comprises receiving a command indicating transitioning to the second operating mode while operating in the first operating mode, wherein the command includes a time value indicative of the time period.

16. The method of claim 13, further comprising:
initiating a first time period while in the safe mode;
said switching comprising switching operation to the second transport protocol using the second type physical interface after expiration of the first time period;
monitoring, by the second type physical interface, an out of range condition and providing an escape signal when the out of range condition is detected;
initiating a second time period after the expiration of the first time period; and
enabling detection of the escape signal after expiration of the second time period.

17. The method of claim 16, wherein said receiving a command comprises receiving a command indicating transitioning to the second operating mode while operating in the first operating mode, wherein the command includes a first time value indicative of the first time period and a second time value indicative of the second time period.

18. The method of claim 16, further comprising dynamically transitioning back to the first operating mode by enabling the first type physical interface to operate according to the first transport protocol when indicated by the mode value or when the escape signal is detected.

19. The method of claim 11, further comprising converting operation between the first and second transport protocols while in the second operating mode.

20. A method of operating an interface, comprising:
monitoring a mode value indicative of one of a first transport protocol and a second transport protocol;
when the first transport protocol is indicated by the mode value, enabling a first type physical interface coupled to a plurality of pads to operate according to the first transport protocol;
when the second transport protocol is indicated by the mode value, enabling a second type physical interface coupled to the plurality of pads to operate according to the transport protocol;
operating at least one of the plurality of pads according to a common mode voltage range when operating according to the second transport protocol; and
when operating according to the second transport protocol, dynamically switching back to operating according to the first transport protocol when a voltage of the at least one of the plurality of pads is outside of the common mode voltage range.

* * * * *